United States Patent
Clark

(10) Patent No.: US 6,940,412 B2
(45) Date of Patent: Sep. 6, 2005

(54) METHOD AND APPARATUS FOR CONFIRMING CONTROL UNIT MOUNT TO NON-CONDUCTIVE SURFACE

(75) Inventor: Jeffrey A. Clark, Sterling Heights, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 272 days.

(21) Appl. No.: 10/199,432

(22) Filed: Jul. 19, 2002

(65) Prior Publication Data

US 2003/0048192 A1 Mar. 13, 2003

Related U.S. Application Data

(60) Provisional application No. 60/318,943, filed on Sep. 13, 2001.

(51) Int. Cl.[7] .............................................. G08B 21/00
(52) U.S. Cl. ........................ 340/635; 340/652; 340/657; 340/687; 439/488
(58) Field of Search .................. 340/635, 652, 340/647, 657, 687, 661; 439/488; 73/1.38, 1.39, 493, 495; 361/386, 388, 389, 399

(56) References Cited

U.S. PATENT DOCUMENTS 5,065,282 A * 11/1991 Polonio ...................... 361/752
6,188,019 B1     2/2001 Baur et al.
6,445,568 B1 *  9/2002 Baur et al. .................. 361/600
6,670,888 B2 * 12/2003 Schmidt et al. ............. 340/687

FOREIGN PATENT DOCUMENTS

EP          0901196          3/1999

OTHER PUBLICATIONS

International Search Report, dated Jan. 29, 2003.

* cited by examiner

*Primary Examiner*—Hung Nguyen

(57) ABSTRACT

An electronic control unit (ECU) is mounted to a non-conductive material housing for installation in a vehicle. In order to diagnose whether or not the ECU is properly installed within the vehicle, a conductive member is placed within the housing. The conductive member includes a pair of pins that are insert molded into the housing such that one end of each pin is electrically connected to the ECU and an opposite end of each pin is exposed at a mounting surface presented by the housing. A fastener is used to mount the housing to the vehicle and includes an enlarged head portion that contacts the exposed ends of the pins, forming an electrical circuit. The ECU monitors the resistance or voltage between the two pins to determine if the ECU is properly mounted. A closed circuit indicates proper mounting and an open circuit indicates improper mounting.

24 Claims, 1 Drawing Sheet

025 # METHOD AND APPARATUS FOR CONFIRMING CONTROL UNIT MOUNT TO NON-CONDUCTIVE SURFACE

CROSS-REFERENCE TO RELATED APPLICATIONS

The application claims priority to U.S. Provisional Application No. 60/318,943, which was filed on Sep. 13, 2001.

BACKGROUND OF THE INVENTION

This invention relates to a method and system that confirms that an electronic control unit has been properly mounted to a non-conductive surface.

An electronic control unit (ECU) is mounted within a vehicle and typically includes such components as a printed circuit board and housing member. Further, the ECU is electrically connected to such components as a front crash sensor, side crash sensor, or other similar sensing components.

Upon installation of the ECU within the vehicle, it is important to verify that the ECU is properly mounted. Traditionally, this verification is accomplished by performing ground detection of the housing to the vehicle mount formed from sheet metal. However, in certain configurations, the ECU has to be mounted to a nonconductive surface, such as a plastic radiator support, for example. In this configuration, ground detection is not possible.

Thus, it is desirable to have a method and system that can determine whether or not an ECU has been properly mounted to a non-conductive surface within the vehicle, as well as overcoming the other above mentioned deficiencies with the prior art.

SUMMARY OF THE INVENTION

A conductive member is positioned within a housing formed from a nonconductive material. An electronic control unit (ECU) is housed within the housing. A portion of the conductive member is exposed at a mounting surface of the housing. A connector is used to attach the housing to a vehicle structure. Proper mounting is indicated when the connector contacts the conductive member to form a closed electrical circuit. If an open circuit is detected, improper installation is indicated.

The method for confirming proper installation of an ECU within a vehicle includes the following steps. The conductive member is formed within the housing such that a portion of the conductive member is exposed relative to the mounting surface. The conductive member is further electrically connected to one of the ECU components. The housing is mounted to a vehicle structure with at least one connector and proper mounting is indicated when a portion of the connector contacts the conductive member to create a closed electric circuit.

Preferably, the conductive member comprises a pair of pins that are molded within the housing, which is formed of a plastic material. One end of each pin is exposed at a mounting surface of the plastic housing while the opposite end of each pin is mounted to an ECU component, such as a printed circuit board, for example. When the connector contacts both pins as the housing is mounted to the vehicle structure, a closed electrical circuit is generated, which indicates proper installation. If an open circuit is detected then improper installation is indicated.

In the preferred embodiment, the connector is a fastener with a cylindrical body portion and an enlarged head portion that engages the mounting surface when the housing is fastened to the vehicle structure. To generate the closed circuit, the head portion contacts both pins in the housing. If the head portion does not contact either pin or contacts only one pin, an open circuit will be detected, indicating improper installation.

The subject apparatus and method allow for a simple way to detect proper mounting of an ECU to a non-conductive surface within a vehicle. These and other features of the present invention can be best understood from the following specifications and drawings, the following of which is a brief description.

DETAILED DESCRIPTION OF A PREFERRED EMBODIMENT

Figure 1:
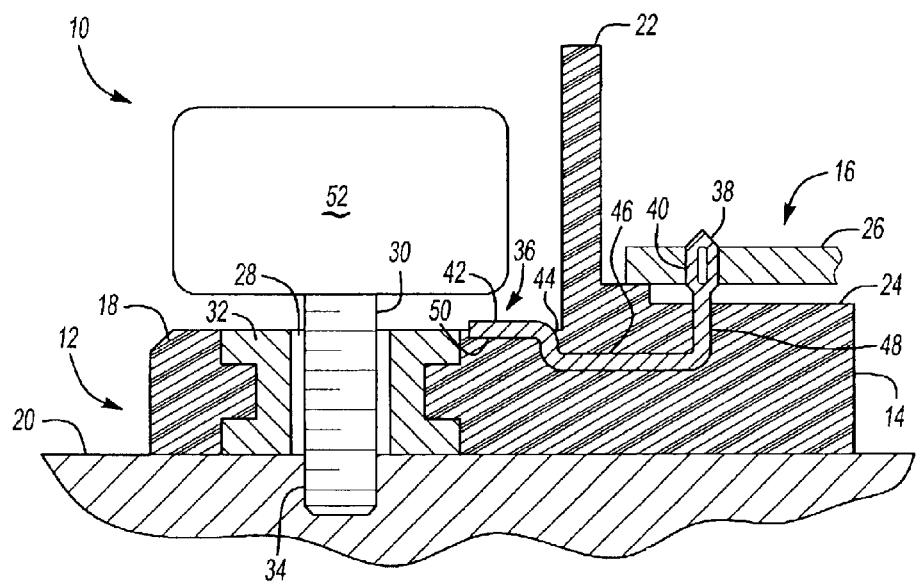
FIG. 1 is a side cross-sectional view of a mounting assembly incorporating the subject invention.

A mounting assembly 10, incorporating the subject invention, is shown generally at 10 in FIG. 1. The mounting assembly 10 includes a housing 12 made from a non-conductive material such as plastic or another similar material known in the art. The housing 12 includes a center portion 14 in which an electronic control unit (ECU) 16 is installed. The housing 12 also includes at least one mounting foot 18 for attaching the housing 12 to a vehicle structure 20, which is disclosed as a non-conductive surface.

The center portion 14 includes a wall portion 22 that defines a recess 24 in which the ECU 16 is mounted. As is known in the art, the ECU 16 includes various components and includes a printed circuit board (PCB) 26. The PCB 26 is electrically connected to other ECU components such as crash sensors (not shown), for example.

The mounting foot 18 extends transversely out from the wall portion 22. It should be understood that while only a single foot 18 is show, several mounting feet 18 could be formed about the periphery of the housing 12. The mounting foot 18 includes at least one bore 28 for receiving a connector element 30, such as a fastener, for example. Preferably, a bushing 32 is installed within the bore 28 and the fastener 30 is mounted within the bushing 32. Preferably, a threaded bolt is used, however, other similar connectors/fasteners known in the art could also be used.

The fastener 30 includes a cylindrical body portion 34 that extends through the bushing 32 and is threaded into the vehicle structure 20 to mount the housing 12 to the vehicle. In order to determine whether or not the housing 12 and associated ECU 16 are properly installed within the vehicle, a conductive member, shown generally at 36, is included within the housing 12. The conductive member 36 cooperates with the fastener 30 to verify installation.

Figure 2:
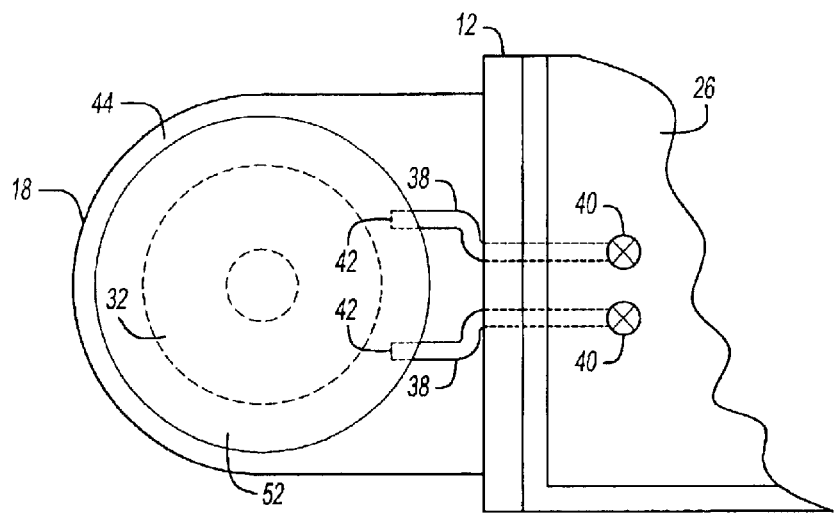
FIG. 2 is a top view of the mounting assembly shown in FIG. 1.

The conductive member 36 includes a pair of metal pins 38 that are preferably insert molded within the housing 12, see FIG. 2. While insert molding is preferred other similar methods known in the art can be used to form or install the pins 38 in the housing 12. One end 40 of each pin 38 is electrically connected to the PCB 26 or other ECU component while the opposite end 42 of each pin 38 is exposed at a mounting surface 44 on the foot 18. Each pin 38 includes a central portion 46 that runs parallel to the vehicle structure 20, an end portion 48 that extends upwardly from the central portion 46 and parallel to the wall portion 22, and a stepped portion 50 that raises up to the mounting surface 44 for exposure.

The fastener 30 includes an enlarged head portion 52 that is larger in diameter than the body portion 34. When the fastener 30 is inserted into bore 28, the fastener is tightened until the head portion 52 contacts the mounting surface 44. The bore 28 is positioned adjacent to the exposed ends 42 of the pins 38 such that the head portion 52 contacts the ends 42 when the fastener 30 is installed. When the head portion 52 contacts both pins 38 a closed electrical circuit is generated, indicating proper installation. If the head portion 52 contacts only one pin end 42 or fails to contact either pin end 42 an open circuit is detected, which indicates improper installation.

Figure 3:
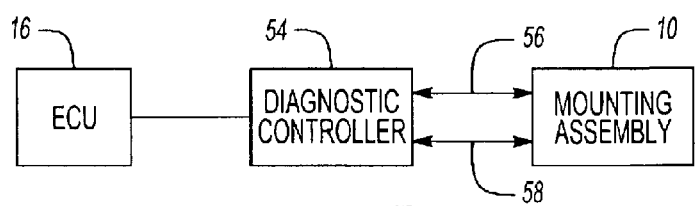
FIG. 3 is a schematic diagram of a control system incorporating the subject invention.

As discussed above, when the ECU 16 and the associated housing 12 are fastened into place in the vehicle, the fastener head portion 52 makes contact with both pins 38, creating an electrical connection. The ECU 16 itself or another diagnostic control unit 54 (see FIG. 3) can then monitor the resistance or voltage between the two pins 38 and determine if the ECU 16 is properly installed. The diagnostic control unit 54 can be the ECU 16 itself, can be a separate unit but incorporated as part of the ECU 16, or can be an entirely separate unit. A first signal 56 is generated when the head portion 52 contacts both pins 38, which indicates a closed circuit and verifies installation. A second signal 58 is generated if an open circuit is detected to indicate improper installation.

The subject provides a simple method and apparatus for verifying installation of a control unit in a vehicle. One of the benefits with the subject invention is that proper installation can be verified even if the ECU is mounted to a non-conductive surface. Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A method for confirming proper mounting of a control unit to a non-conductive surface comprising the steps of:
    (a) supporting a conductive assembly within a non-conductive member that defines a mounting surface such that a portion of the conductive assembly is exposed relative to the mounting surface and disposed outside the non-conductive member;
    (b) electrically connecting the conductive assembly to an electronic control unit component;
    (c) securing the non-conductive member to a vehicle structure with at least one connector; and
    (d) indicating proper mounting when a portion of the connector contacts the conductive assembly to create a closed electric circuit.

2. A method according to claim 1 wherein step (d) further includes indicating improper mounting when there is an open circuit.

3. A method according to claim 1 wherein the conductive assembly comprises at least two pins and wherein step (a) includes exposing one end of each pin at the mounting surface.

4. A method according to claim 3 wherein step (b) includes electrically connecting an opposite end of each pin to the electronic control unit component.

5. A method according to claim 4 wherein step (d) further includes monitoring a predetermined electrical characteristic between the pins to determine proper mounting.

6. A method according to claim 5 wherein the at least one connector comprises at least one fastener having an enlarged head portion; wherein step (c) includes fastening the non-conductive member to the vehicle structure such that the head portion contacts the pins; and wherein step (d) includes indicating proper mounting of the electronic control unit component to the non-conductive member when a closed circuit is generated by contact between the head portion and the pins and indicating an improper mounting of the electronic control unit component to the non-conductive member when an open circuit is generated.

7. A method according to claim 3 wherein step (a) includes inserting molding the pins into the non-conductive member.

8. A method according to claim 3 wherein the pins are formed from a metallic material and the non-conductive member is formed from a plastic material.

9. A method according to claim 6, wherein said fastener is threaded, such that when said fastener is properly threaded into said vehicle structure, said head portion contacts the pins.

10. A method according to claim 1, wherein a portion of said vehicle structure receiving said at least one connector is non-conductive.

11. A method for confirming proper mounting of a control unit to a non-conductive surface comprising the steps of:
    (a) installing a metallic pin assembly within a non-conductive housing member having a mounting surface such that a portion of the pin assembly is exposed relative to the mounting surface and disposed outside the non-conductive housing;
    (b) electrically connecting the pin assembly to an electronic control unit component;
    (c) securing the non-conductive housing member to a vehicle structure with at least one connector; and
    (d) indicating proper mounting when a portion of the connector contacts the pin assembly to create a closed electric circuit and indicating improper mounting when an open circuit is detected.

12. A method according to claim 11 wherein the non-conductive housing member is comprised of a plastic material.

13. A method according to claim 12 wherein step (a) further includes insert molding the pin assembly into the housing member such that one end of the pin assembly is exposed at the mounting surface and an opposite end of the pin assembly is exposed for connection to the electronic control unit component.

14. A method according to claim 13 wherein the pin assembly comprises a pair of pins spaced laterally apart from each other within the housing member.

15. A method according to claim 14 wherein the electronic control unit comprises a printed circuit board.

16. A method according to claim 15 wherein the at least one connector comprises at least one metal fastener having an enlarged head portion; wherein step (c) includes fastening the non-conductive member to the vehicle structure such that the head portion contacts the pins; and wherein step (d) includes indicating proper mounting of the electronic control unit component to the non-conductive member when a closed circuit is generated by contact between the head portion and the pins and indicating an improper mounting of the electronic control unit component to the non-conductive member when an open circuit is generated by non-contact between the head portion and at least one of the pins.

17. A method according to claim 16 wherein step (d) further includes monitoring resistance or voltage between the pins to detect an open or closed circuit.

18. A method according to claim 16, wherein said fastener is threaded, such that when said fastener is properly threaded into said vehicle structure, said head portion, contacts the pins.

19. A method according to claim 11, wherein a portion of said vehicle structure receiving said at least one connector is non-conductive.

20. A control unit mounting apparatus comprising:
a non-conductive housing member presenting a mounting surface;
a conductive member mounted within said housing member having one end exposed at said mounting surface and disposed outside said housing member and an opposite end electrically connected to a control unit component;
at least one fastener for mounting said housing member to a vehicle structure wherein said fastener includes a body portion that extends through said housing member and a head portion having a larger diameter than said body portion that is engageable with said mounting surface; and
a diagnostic controller for detecting proper mounting of a control unit to the vehicle wherein a first signal is generated and sent to said diagnostic controller when said head portion contacts said conductive member to generate a closed electrical circuit and wherein a second signal is generated and sent to said diagnostic controller when said head portion fails to properly contact said conductive member to generate an open circuit.

21. An apparatus according to claim 20 wherein said conductive member comprises a pair of metal pins installed within said housing member.

22. An apparatus according to claim 21 wherein said first signal is generated when said head portion contacts both of said pins to generate a closed circuit and wherein said second signal is generated when said head portion fails to contact at least one of said pins.

23. An apparatus according to claim 22 wherein said non-conductive housing member is comprised of a plastic material and said control unit component comprises a printed circuit board.

24. An apparatus according to claim 20, wherein said at least one fastener is threaded, such that it may be threaded into the vehicle structure, with said head portion contacting said conductive material when said fastener is adequately received within the vehicle structure.

* * * * *